US011524271B2

(12) United States Patent
Choa et al.

(10) Patent No.: US 11,524,271 B2
(45) Date of Patent: Dec. 13, 2022

(54) THIN FILM GETTER AND MANUFACTURING METHOD THEREFOR

(71) Applicant: INDUSTRY-UNIVERSITY COOPERATION FOUNDATION HANYANG UNIVERSITY ERICA CAMPUS, Ansan-Si (KR)

(72) Inventors: Yongho Choa, Ansan-si (KR); Hyoryoung Lim, Chuncheon-si (KR); Nusia Eom, Pyeongtaek-si (KR)

(73) Assignee: INDUSTRY-UNIVERSITY COOPERATION FOUNDATION HANYANG UNIVERSITY ERICA CAMPUS, Ansan-Si (KR)

( * ) Notice: Subject to any disclaimer, the term of this patent is extended or adjusted under 35 U.S.C. 154(b) by 433 days.

(21) Appl. No.: 16/642,935

(22) PCT Filed: Aug. 28, 2017

(86) PCT No.: PCT/KR2017/009389
§ 371 (c)(1),
(2) Date: Feb. 28, 2020

(87) PCT Pub. No.: WO2019/045126
PCT Pub. Date: Mar. 7, 2019

(65) Prior Publication Data
US 2020/0346184 A1 Nov. 5, 2020

(51) Int. Cl.
*C23C 14/16* (2006.01)
*C23C 14/34* (2006.01)
(Continued)

(52) U.S. Cl.
CPC .......... *B01J 20/0225* (2013.01); *B01D 53/02* (2013.01); *B01J 20/0211* (2013.01);
(Continued)

(58) Field of Classification Search
CPC ... B01D 53/02; B01D 2257/108; H01L 21/02; H01L 21/324; H01L 23/26; H01L 21/322; B01J 20/0225; B01J 20/3236; B01J 20/3204; B01J 20/0211; C23C 14/5806; C23C 14/3464; C23C 14/165; B81B 7/0038; C01B 3/0005
See application file for complete search history.

(56) References Cited

U.S. PATENT DOCUMENTS 6,027,986 A   2/2000   Conte et al.
6,753,647 B2  6/2004   Kim
(Continued)

FOREIGN PATENT DOCUMENTS

JP   2006228690    8/2006
KR   1020020094711 1/2004
(Continued)

*Primary Examiner* — Timothy C Vanoy
(74) *Attorney, Agent, or Firm* — Finch & Maloney PLLC

(57) ABSTRACT

A thin film getter is provided. The thin film getter comprises a substrate and an absorption layer on the substrate, wherein the absorption layer comprises a getter material for absorbing target gas and an auxiliary material for providing a moving path of the target gas, and the getter material can be divided into a plurality of getter regions by the auxiliary material.

11 Claims, 15 Drawing Sheets

(51) Int. Cl.
*C23C 14/58* (2006.01)
*B01J 20/02* (2006.01)
*B01J 20/32* (2006.01)
*B01D 53/02* (2006.01)
*C01B 3/00* (2006.01)
*B81B 7/00* (2006.01)
*H01L 23/26* (2006.01)

(52) U.S. Cl.
CPC ....... *B01J 20/3204* (2013.01); *B01J 20/3236* (2013.01); *C01B 3/0005* (2013.01); *C23C 14/165* (2013.01); *C23C 14/3464* (2013.01); *C23C 14/5806* (2013.01); *B01D 2257/108* (2013.01); *B81B 7/0038* (2013.01); *H01L 23/26* (2013.01)

(56) References Cited

U.S. PATENT DOCUMENTS

| | | |
|---|---|---|
| 7,586,260 B2 | 9/2009 | Tonegawa et al. |
| 8,986,569 B2 | 3/2015 | Kullberg et al. |
| 2003/0001499 A1 | 1/2003 | Kim |
| 2013/0202921 A1 | 8/2013 | Rizzi et al. |
| 2014/0227566 A1 | 8/2014 | Luca et al. |

FOREIGN PATENT DOCUMENTS

| | | | |
|---|---|---|---|
| KR | 1020100040332 | 2/2006 | |
| WO | WO 2008/071906 A1 * | 6/2008 | ............. C23C 14/14 |

* cited by examiner

[Fig. 1]
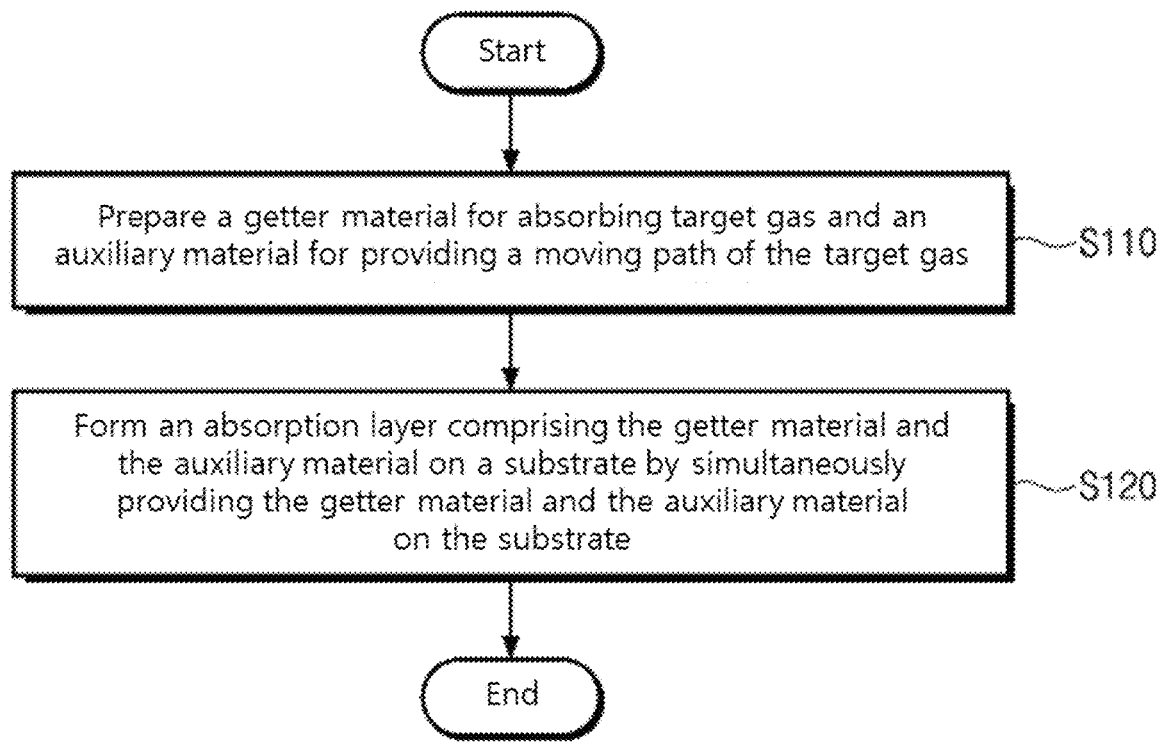

[Fig. 2]
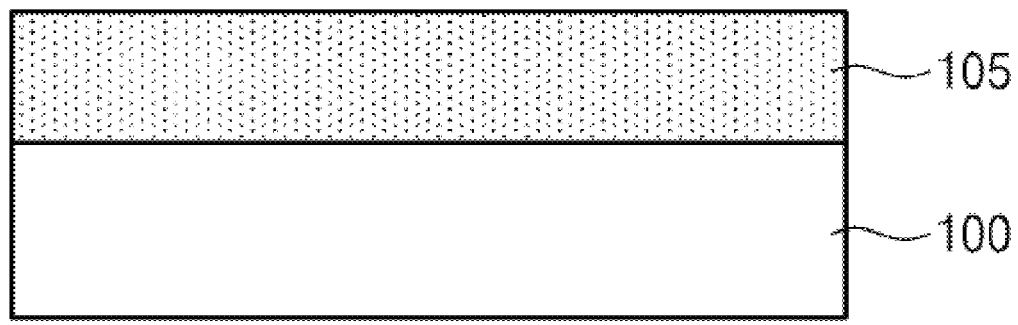
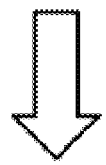
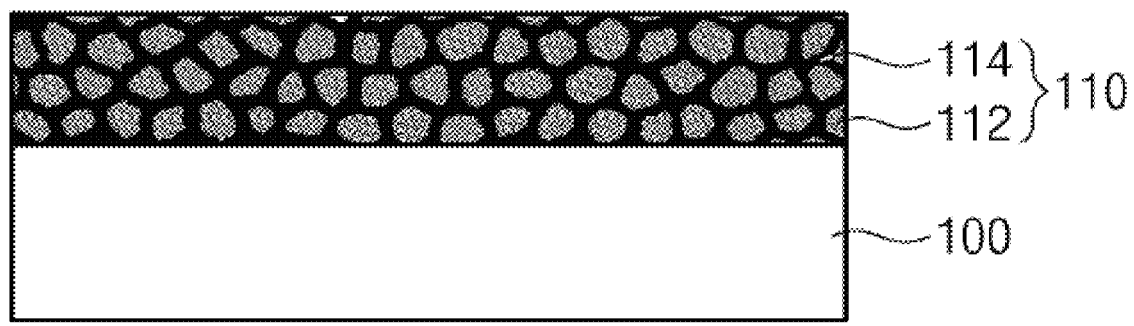

[Fig. 3]
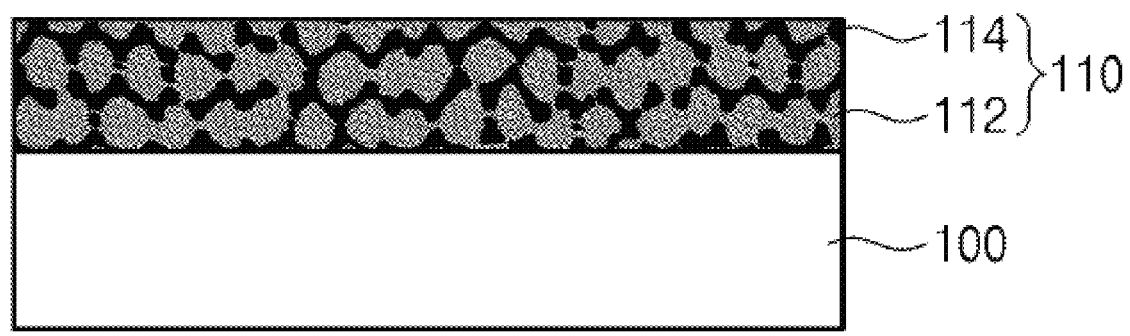

[Fig. 4]
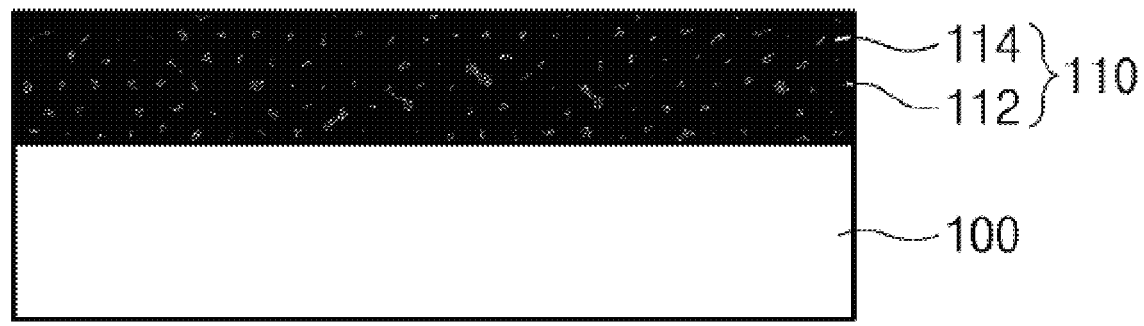

[Fig. 5]
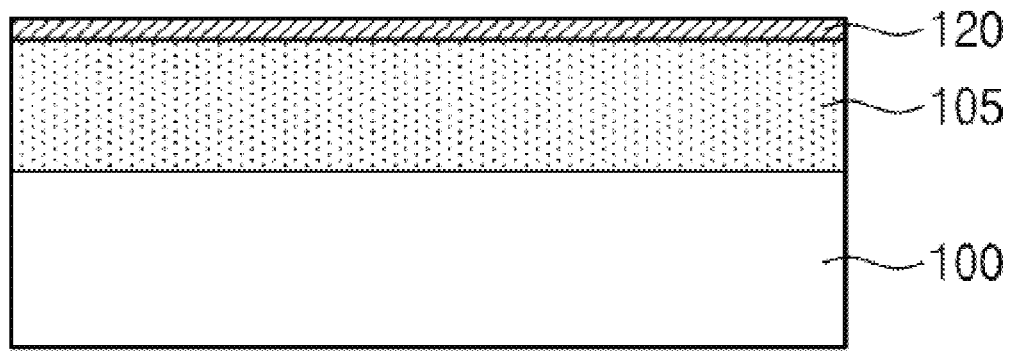
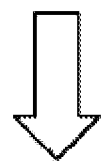
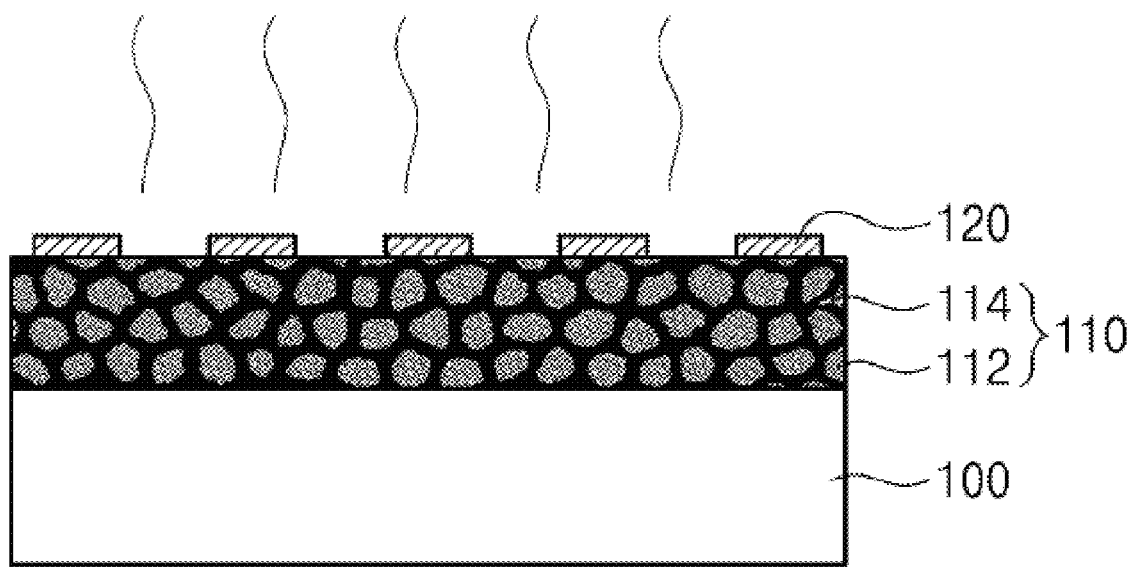

[Fig. 6]
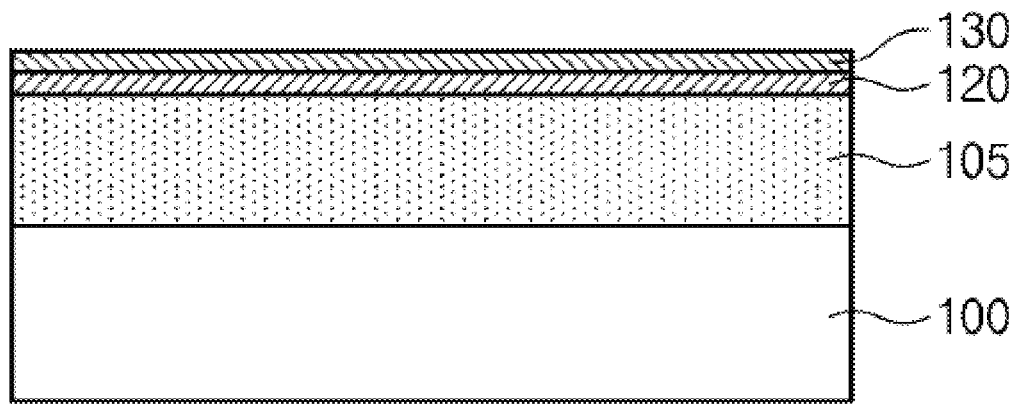
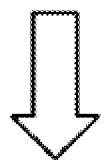
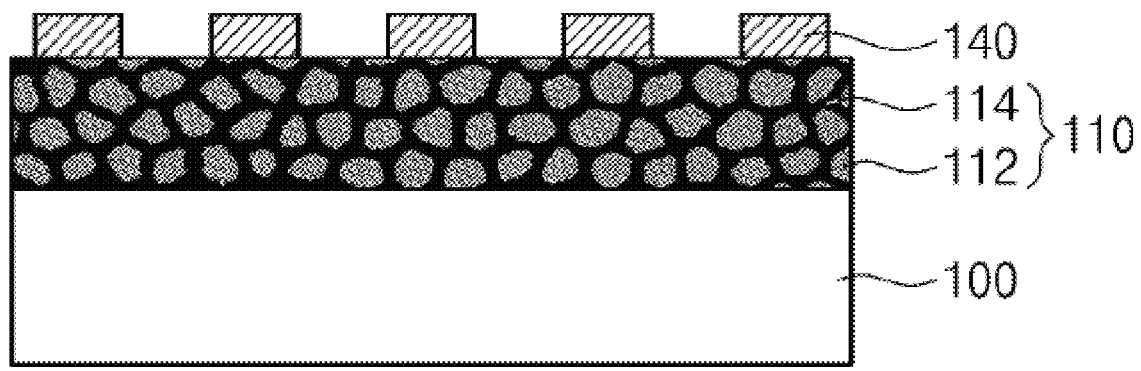

[Fig. 7]
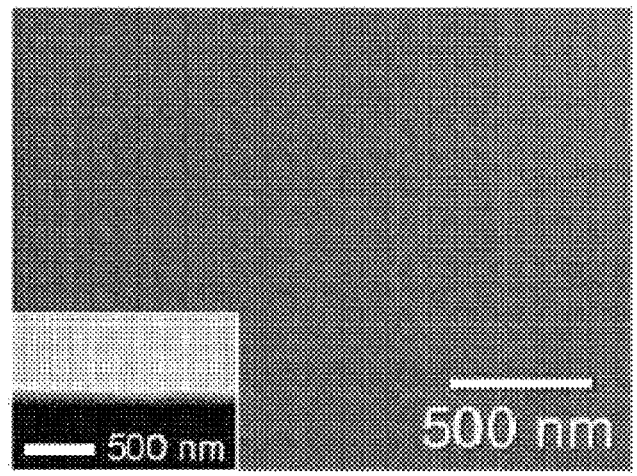
(a)
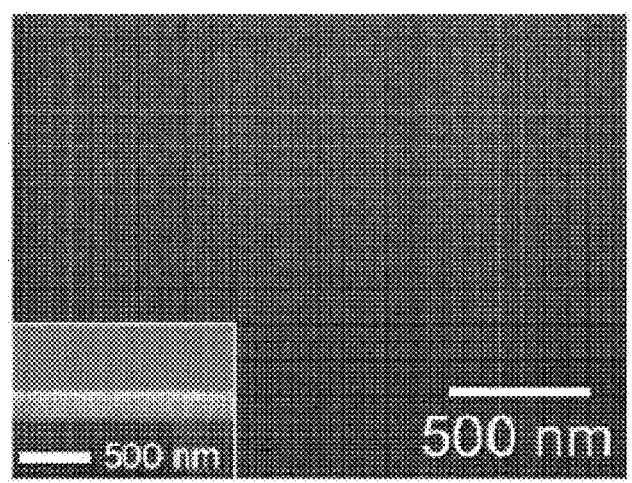
(b)
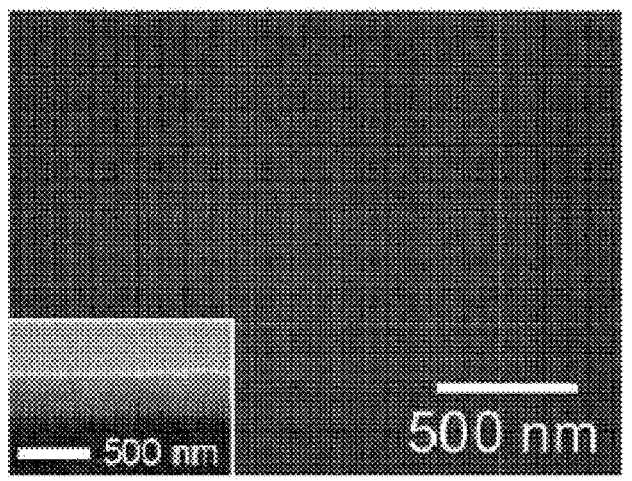
(c)

[Fig. 8]
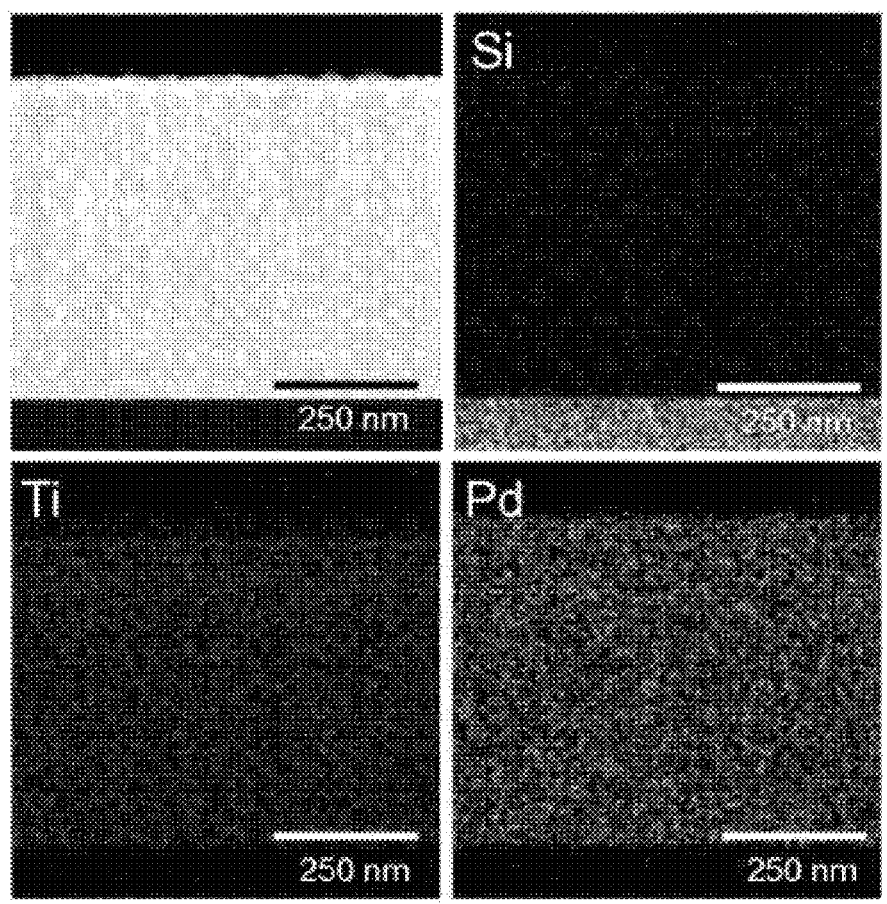

[Fig. 9]
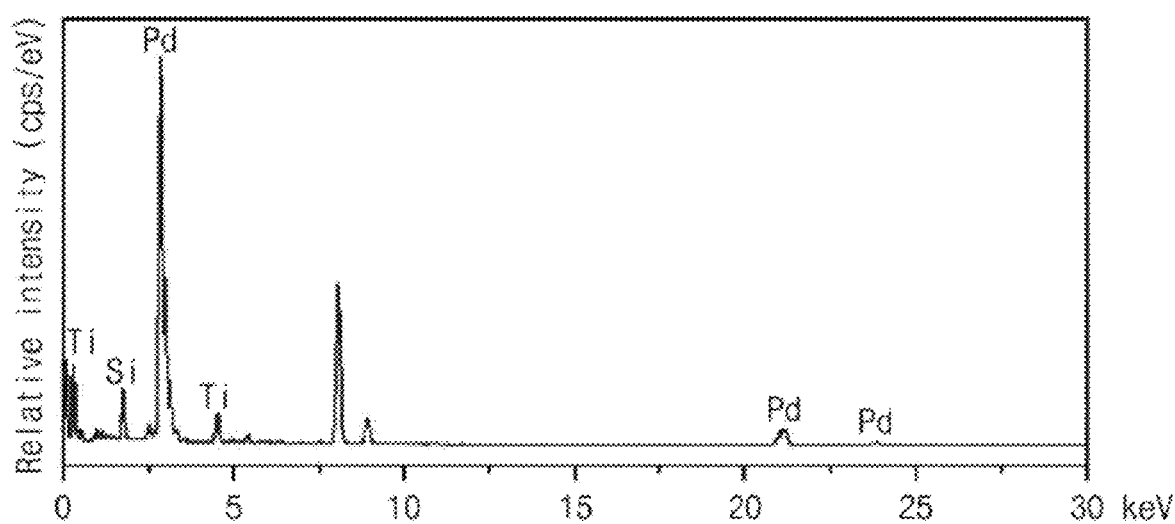

[Fig. 10]
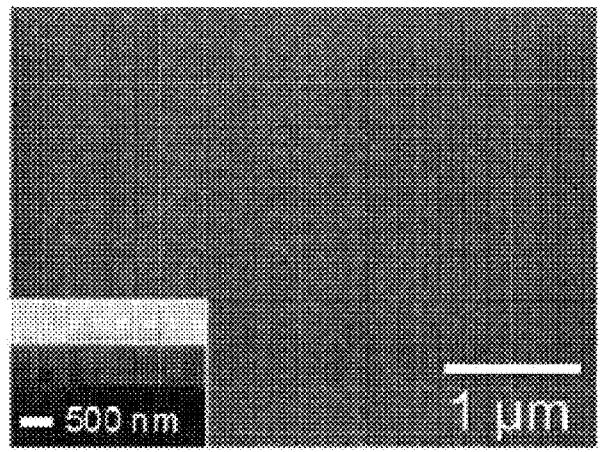
(a)
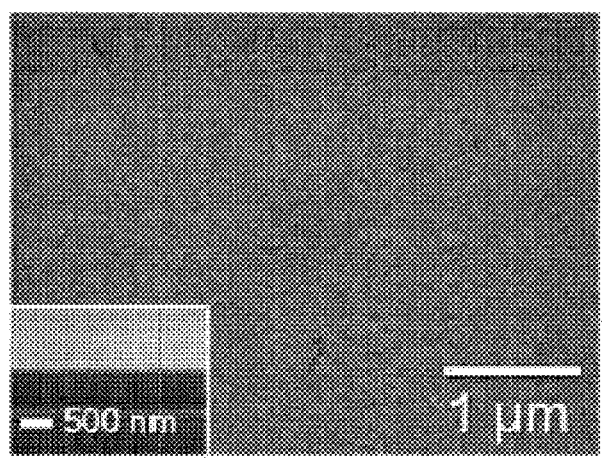
(b)
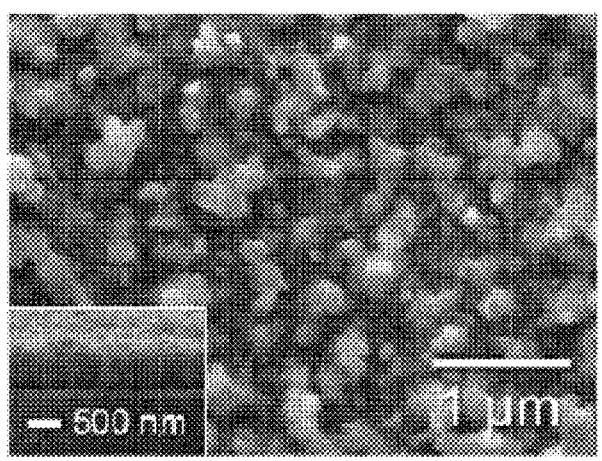
(c)

[Fig. 12]
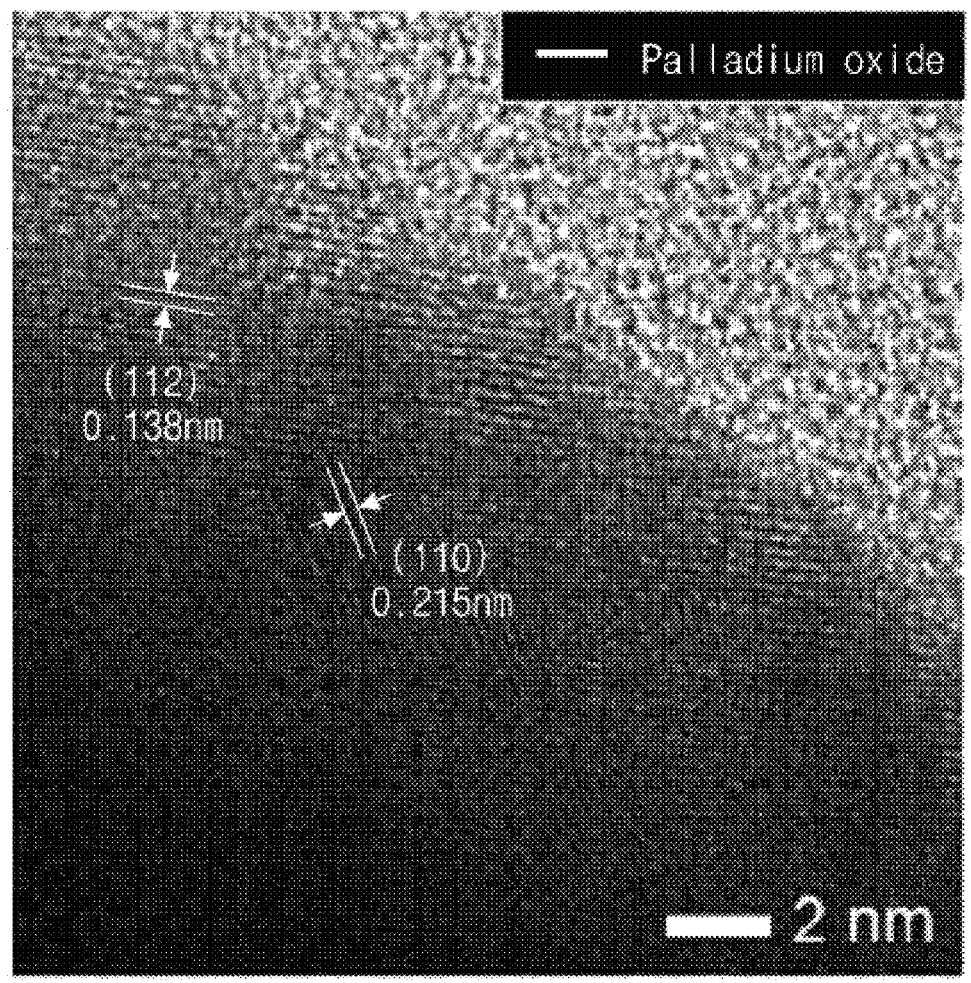

[Fig. 13]
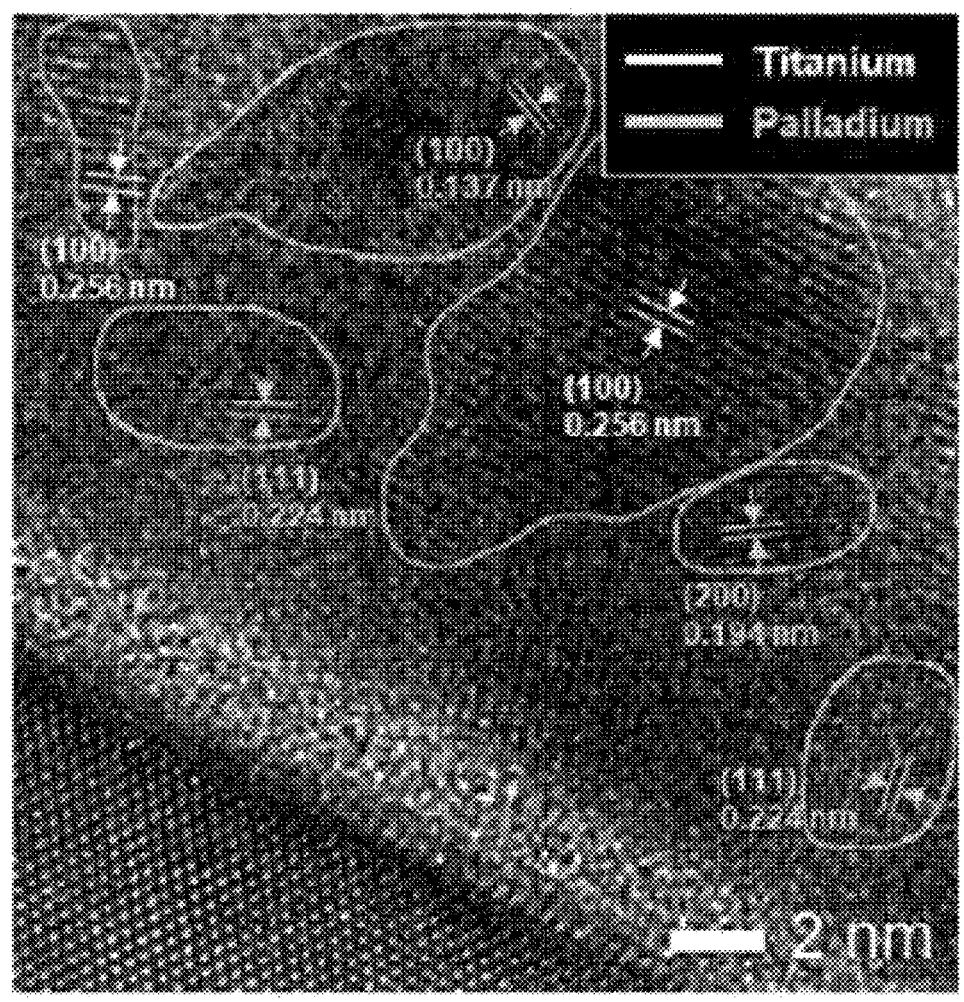

[Fig. 14]
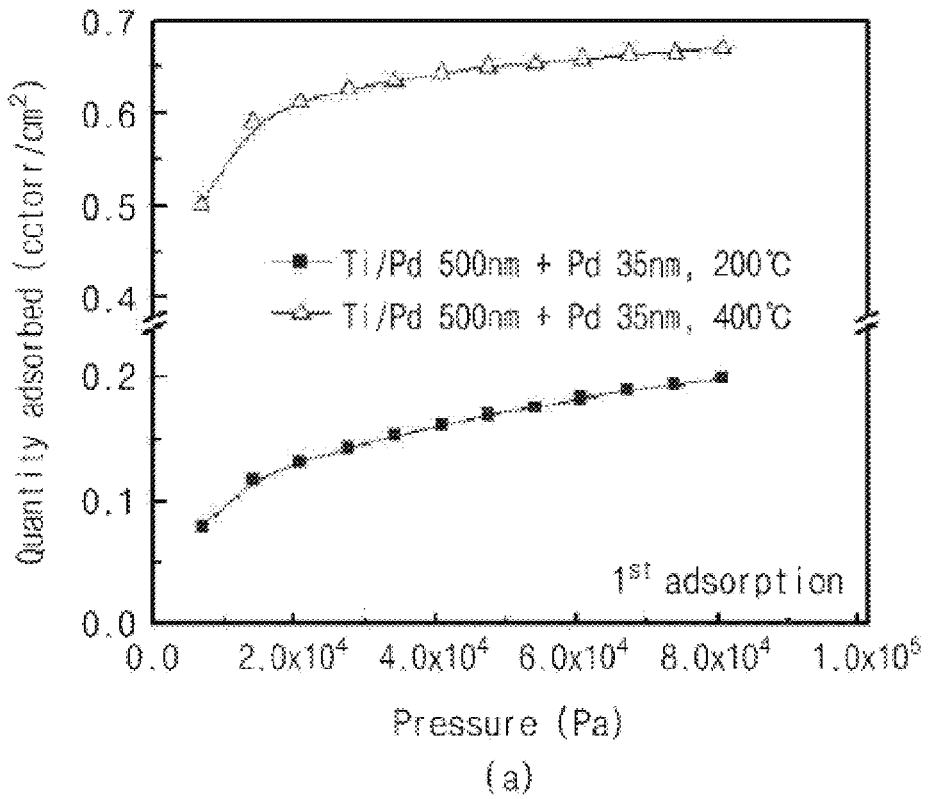
(a)
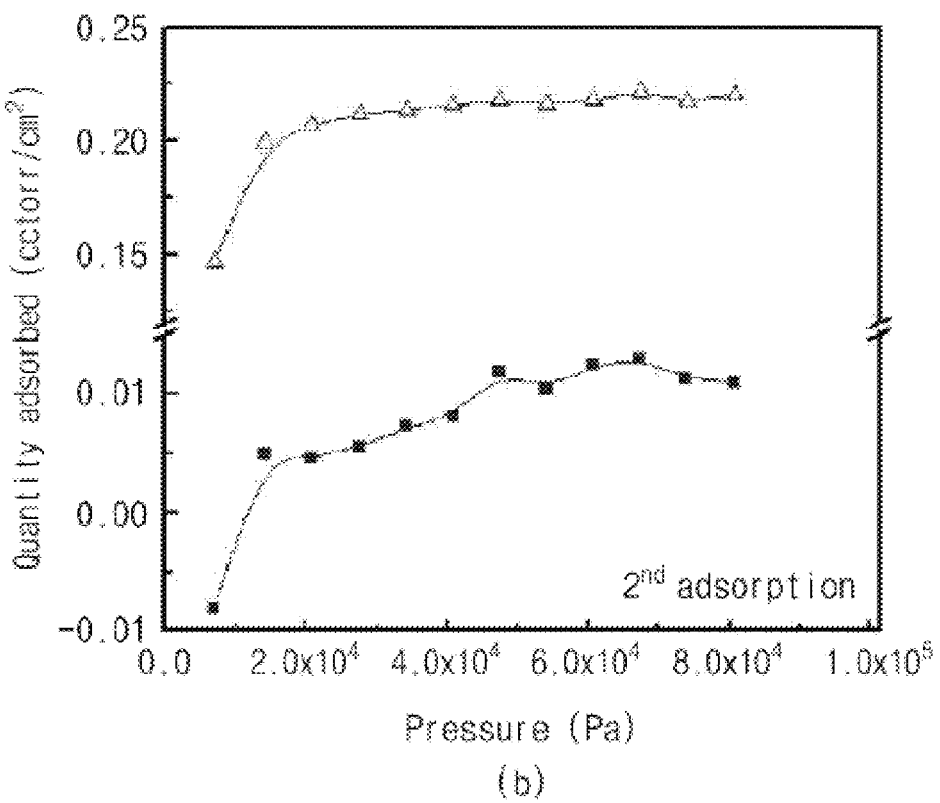
(b)

[Fig. 15]
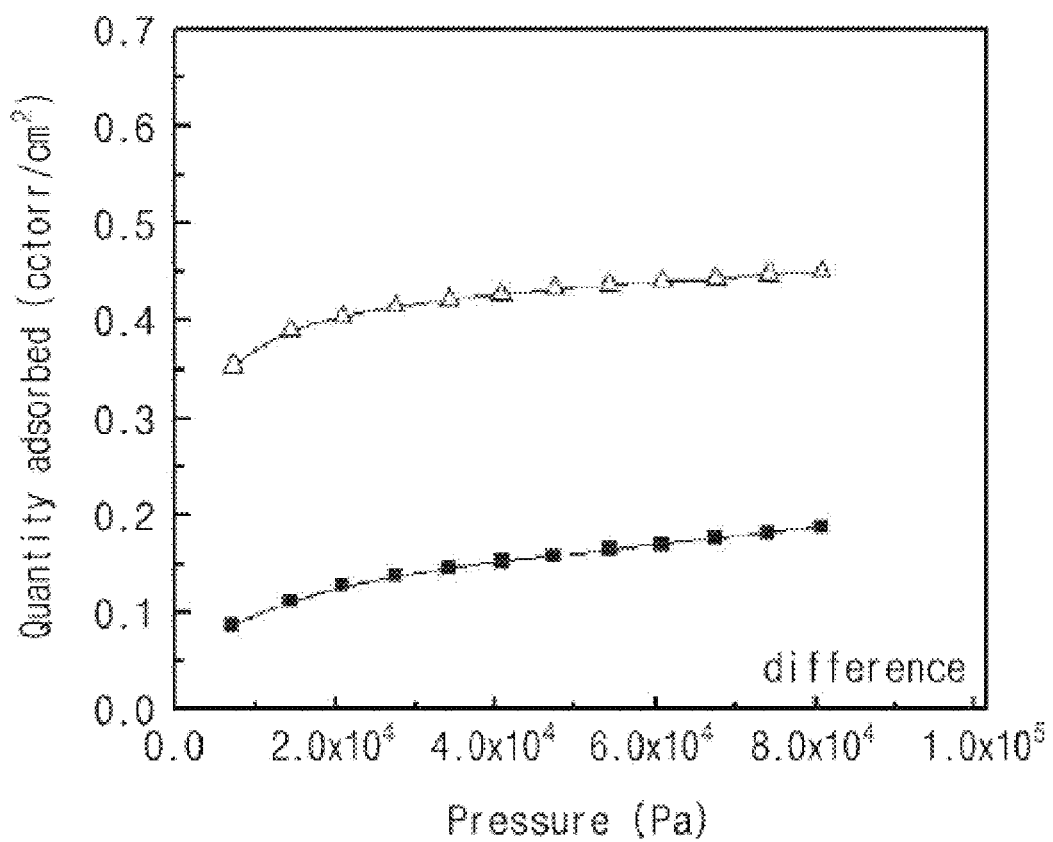

THIN FILM GETTER AND MANUFACTURING METHOD THEREFOR

TECHNICAL FIELD

The present invention relates to a thin film getter and a method for manufacturing the same, and more particularly to a thin film getter simultaneously including a getter material for absorbing target gas and an auxiliary material for providing a moving path of the target gas, and a method for manufacturing the same.

BACKGROUND ART

A getter is a kind of absorbent that collectively refers to metals and compound materials which remove gas remaining or additionally occurring in a sealed vacuum system so as to maintain a constant vacuum state inside the device for a long period of time. By doing so, the getter is mounted in or deposited to a cavity or a wall surface in a vacuum-packaged device so as to physically or chemically absorb a small amount of gaseous impurities such as hydrogen ($H_2$), oxygen ($O_2$), vapor ($H_2O$), carbon oxide, hydrocarbon, etc. This getter is applied to lamps, TVs, monitors, thermo bottles, refrigerators, pumps, etc., which are commonly encountered in everyday life, so as to exhibit a good quality for a long period of time, and has widen its scope of application toward gyroscope, particle accelerator, infrared (IR) detector and display fields with an advance in industry.

To improve service life and performance of MEMS and other semiconductor devices, a constant degree of vacuum is required in the devices. However, it is impossible to manufacture those devices in a perfect vacuum state due to diffusion, leak or the like in a process. In particular, hydrogen gas ($H_2$) generated during a semiconductor process is diffused and dissolved in devices, and then volatilized after hermetic sealing, and thus becomes a cause of deteriorating the degree of vacuum and performance. For example, a decrease in the degree of vacuum inside an IR detector may lower a performance of devices such as a bolometer, etc., and thus remarkably deteriorates an infrared sensing capacity. Thus, it is essential to attach at least one getter inside a semiconductor device to maintain a stable degree of vacuum in the device for a long period of time.

A conventional getter may be manufactured in a form of bulk, plate, etc., from the outside such as a screened getter, a sintered getter, etc., and then may be moved and mounted inside the device, or may be deposited in a form of thin film onto a region, in which the getter is to be formed, such as a surface wall inside the device, a part of a cap wafer or the like and may be used by bonding the package. Out of those getters, a getter used for semiconductor package is a non-evaporable getter (NEG) in a form of thin film which may be deposited onto a desired region, may be used without sintering at a high temperature and under high vacuum, may prevent particle by-products, may not require a process of moving from the outside, and may be easily vacuum-closed.

DISCLOSURE

Technical Problem

One technical object of the present invention is to provide a high-reliable thin film getter and a method for manufacturing the same.

Another technical object of the present invention is to provide a thin film getter with a maximized feature of gas absorption, and a method for manufacturing the same.

Still another technical object of the present invention is to provide a thin film getter with a decrease in activation temperature, and a method for manufacturing the same.

Still another technical object of the present invention is to provide a thin film getter for absorbing hydrogen gas, and a method for manufacturing the same.

Still another technical object of the present invention is to provide a thin film getter with an improved surface area of a getter material, and a method for manufacturing the same.

Still another technical object of the present invention is to provide a thin film getter with a simplified manufacturing process, and a method for manufacturing the same.

Still another technical object of the present invention is to provide a thin film getter with a less manufacturing cost, and a method for manufacturing the same.

Still another technical object of the present invention is to provide a method for manufacturing a thin film getter, which is easily compatible with a process for manufacturing a device onto which a getter is mounted.

The technical objects of the present invention are not limited to the above.

Technical Solution

To solve the technical objects above, the present invention may provide a thin film getter.

According to one embodiment, the thin film getter may include a substrate and an absorption layer on the substrate, in which the absorption layer may include a getter material for absorbing target gas and an auxiliary material for providing a moving path of the target gas, and the getter material may be divided into a plurality of getter regions by the auxiliary material.

According to one embodiment, the auxiliary material may have a plurality of branches in the getter material and the getter material may be divided into a plurality of getter regions by the plurality of branches.

According to one embodiment, an absorption amount of the target gas may be increased as a content of the getter material is increased in the absorption layer. A speed of absorbing the target gas may be increased as a content of the auxiliary material is increased in the absorption layer.

According to one embodiment, the getter material and the auxiliary material may be simultaneously provided in the same process.

According to one embodiment, the target gas may include hydrogen gas.

According to one embodiment, the thin film getter may further include a protective layer disposed on the absorption layer and formed of a material different from the auxiliary material.

According to one embodiment, the protective layer may have a melting point lower than that of the auxiliary material.

To solve the technical objects above, the present invention may provide a method for manufacturing a thin film getter.

According to one embodiment, the method for manufacturing a thin film getter may include preparing a getter material for absorbing target gas and an auxiliary material for providing a moving path of the target gas, and forming an absorption layer including the getter material and the auxiliary material on a substrate by simultaneously providing the getter material and the auxiliary material on the substrate.

According to one embodiment, the forming of the absorption layer may include forming a preliminary absorption layer by simultaneously providing the getter material and the auxiliary material on the substrate; and forming the absorption layer by carrying out an activation process of heat-treating the preliminary absorption layer, in which the preliminary absorption layer may be heat-treated, so that the auxiliary material may have a plurality of branches extending in the getter material and the getter material may be divided into a plurality of getter regions by the plurality of branches.

According to one embodiment, the method for manufacturing a thin film getter may further include forming a protective layer on the preliminary absorption layer, in which the protective layer may be heat-treated by the activation process of the preliminary absorption layer, so as to form a plurality of openings for exposing the absorption layer in the protective layer.

According to one embodiment, the getter material and the auxiliary material may be simultaneously provided onto the heated substrate, so that the auxiliary material may have a plurality of branches extending in the getter material and the getter material may be divided into a plurality of getter regions by the plurality of branches.

According to one embodiment, the getter material and the auxiliary material may be simultaneously provided onto the substrate through sputtering or vapor deposition methods.

Advantageous Effects

A thin film getter according to embodiments of the present invention may include a substrate and an absorption layer on the substrate, in which the absorption layer may include a getter material for absorbing target gas and an auxiliary material for providing a moving path of the target gas, and the getter material may be divided into a plurality of getter regions by the auxiliary material. Accordingly, a surface area of the getter material for absorbing target gas may become wider, thereby improving an efficiency of absorbing the target gas.

Further, the auxiliary material may have a branch which divides the getter material into the plurality of getter regions, thereby improving a speed of absorbing the target gas.

DESCRIPTION OF DRAWINGS

FIG. 1 is a flow chart for explaining a method for manufacturing a thin film getter according to an embodiment of the present invention.

FIG. 2 is a view for explaining a thin film getter according to a first embodiment of the present invention and a method for manufacturing the same.

FIG. 3 is a view for explaining a thin film getter according to a first modified example of the first embodiment of the present invention and a method for manufacturing the same.

FIG. 4 is a view for explaining a thin film getter according to a second modified example of the first embodiment of the present invention and a method for manufacturing the same.

FIG. 5 is a view for explaining a thin film getter according to a third embodiment of the present invention and a method for manufacturing the same.

FIG. 6 is a view for explaining a thin film getter according to a fourth embodiment of the present invention and a method for manufacturing the same.

FIG. 7 is an FE-SEM picture showing a thin film according to Example 1 and Comparative Examples 1 to 2 of the present invention.

FIG. 8 is a STEM and TEM-EDS mapping picture showing a Ti—Pd thin film according to Example 2 of the present invention.

FIG. 9 is a graph showing TEM-EDS results of a Ti—Pd thin film according to Example 2 of the present invention.

FIG. 10 is an FE-SEM picture showing a thin film getter according to Example 2 of the present invention.

FIG. 12 is an HR-TEM picture of a Pd protective layer of a thin film getter according to Example 2 of the present invention.

FIG. 13 is an HR-TEM picture of a Ti—Pd thin film of a thin film getter according to Example 2 of the present invention.

FIG. 14 is a graph showing results of analyzing a degree of hydrogen absorption according to a temperature of an activation process of a Ti—Pd thin film according to Example 2 of the present invention.

FIG. 15 is a graph comparing degrees of hydrogen absorption according to temperatures of an activation process of a Ti—Pd thin film according to Example 2 of the present invention.

MODE FOR INVENTION

Figure 11:
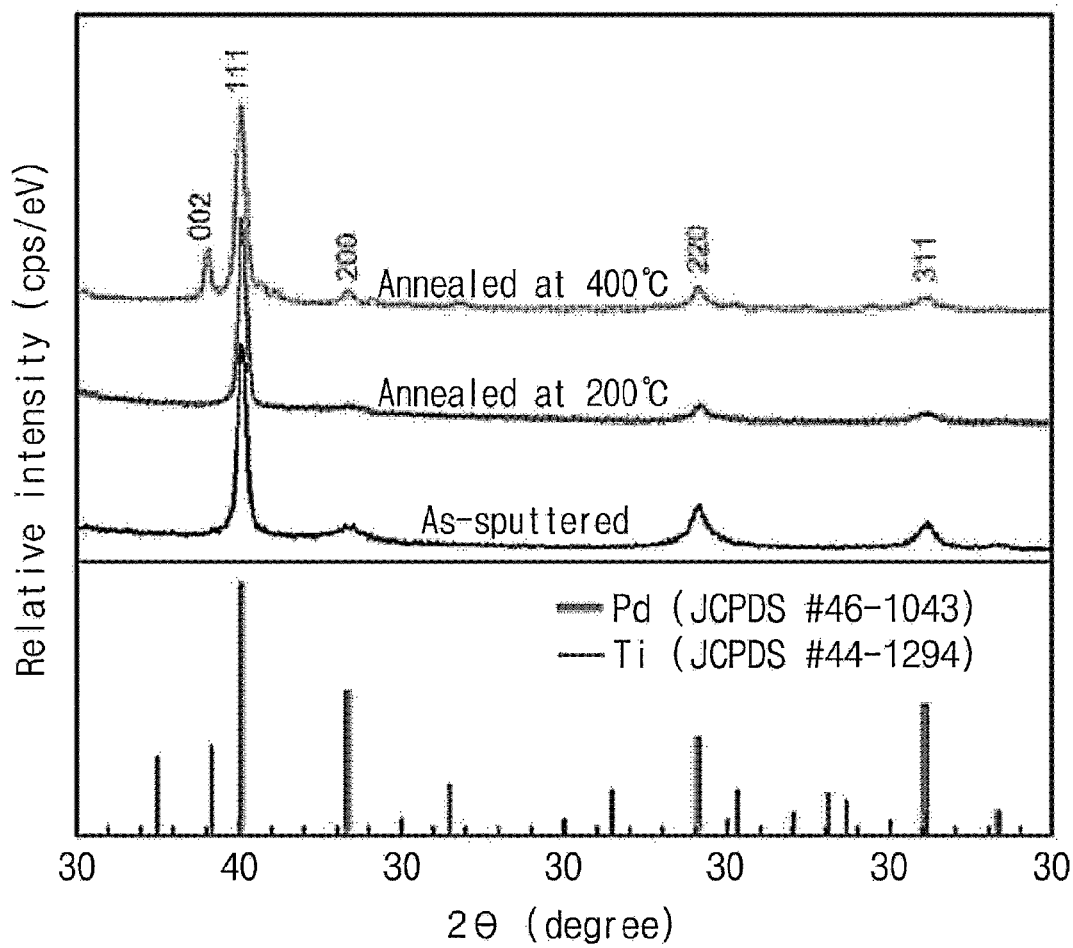
FIG. 11 is a graph showing XRD analysis results from an activation process of a Ti—Pd thin film according to Example 2 of the present invention.

Hereinafter, preferred embodiments of the present invention will be described in detail with reference to the accompanying drawings. However, the technical spirit of the present invention is not limited to the embodiments, but may be realized in different forms. The embodiments introduced herein are provided to sufficiently deliver the spirit of the present invention to those skilled in the art so that the disclosed contents may become thorough and complete.

When it is mentioned in the specification that one element is on another element, it means that the first element may be directly formed on the second element or a third element may be interposed between the first element and the second element. Further, in the drawings, the thicknesses of the membrane and areas are exaggerated for efficient description of the technical contents.

Further, in the various embodiments of the present invention, the terms such as first, second, and third are used to describe various elements, but the elements are not limited to the terms. The terms are used only to distinguish one element from another element. Accordingly, an element mentioned as a first element in one embodiment may be mentioned as a second element in another embodiment. The embodiments illustrated here include their complementary embodiments. Further, the term "and/or" in the specification is used to include at least one of the elements enumerated in the specification.

In the specification, the terms of a singular form may include plural forms unless otherwise specified. Further, the terms "including" and "having" are used to designate that the features, the numbers, the steps, the elements, or combination thereof described in the specification are present, and may be understood that one or more other features, numbers, step, elements, or combinations thereof may be added. In addition, the term "connection" used herein may include the meaning of indirectly connecting a plurality of components, and directly connecting a plurality of components.

Further, in the following description of the present invention, a detailed description of known functions and configurations incorporated herein will be omitted when it may make the subject matter of the present invention unnecessarily unclear.

FIG. 1 is a flow chart for explaining a method for manufacturing a thin film getter according to an embodiment of the present invention, and FIG. 2 is a view for explaining a thin film getter according to a first embodiment of the present invention and a method for manufacturing the same.

Referring to FIGS. 1 and 2, a substrate 100 is prepared. The substrate 100 may be one of a silicon semiconductor substrate, a plastic substrate, a glass substrate and a compound semiconductor substrate.

A getter material 112 for absorbing target gas and an auxiliary material 114 for providing a moving path of the target gas are prepared (S110).

According to one embodiment, the target gas may include hydrogen gas. Alternatively, according to another embodiment, the target gas may be one of vapor, carbon-containing gas, or nitrogen-containing gas.

The getter material 112 may include a metal having a high degree of absorbing the target gas. For example, if the target gas is hydrogen gas, the getter material 112 may include at least one of titanium (Ti), zirconium (Zr), vanadium (V), aluminum (Al), or iron (Fe).

The auxiliary material 114 may include a metal having a high permeability of the target gas. For example, if the target gas is hydrogen gas, the auxiliary material 114 may include at least one of platinum (Pt), palladium (Pd), platinum (Pt), gold (Au), silver (Ag), copper (Cu), nickel (Ni), ruthenium (Ru), or rhodium (Rh).

The getter material 112 and the auxiliary material 114 may be simultaneously provided onto the substrate 100, so that a preliminary absorption layer 105 including the getter material 112 and the auxiliary material 114 may be formed (S120).

According to one embodiment, the preliminary absorption layer 105 may be formed through a sputtering method. Specifically, the preliminary absorption layer 105 may be formed on the substrate 100 by preparing the substrate 100, the getter material 112, and the auxiliary material 114 in a chamber and simultaneously depositing the getter material 112 and the auxiliary material 114 onto the substrate 100. In this case, a ratio of the getter material 112 and the auxiliary material 114 may be adjusted in the preliminary absorption layer 105, which adjusts a condition for forming the getter material 112 and the auxiliary material 114.

Alternatively, according to another embodiment, the preliminary absorption layer 105 may be formed through a vapor deposition method or a solution process.

The preliminary absorption layer 105 may be provided in a state in which an element of forming the getter material 112 and an element of forming the auxiliary material 114 are mixed in a substantially homogeneous way. For example, the preliminary absorption layer may be provided onto the substrate 100 in a state in which Ti and Pd are mixed in a substantially homogeneous way.

An activation process for heat-treating the preliminary absorption layer 105 may be performed. According to one embodiment, the activation process may be performed after the preliminary thin film getter including the substrate 100 and the preliminary absorption layer 105 is provided in the device.

The absorption layer 110 may be formed on the substrate 100 by heat-treating the preliminary absorption layer 105. The auxiliary material 114 may have a plurality of branches extending in the getter material 112. The plurality of branches of the auxiliary material 114 extend in any direction in the getter material 112 so as to divide the getter material 112 into a plurality of getter regions.

According to one embodiment, pores may be formed inside the absorption layer 110 due to a difference of thermal expansion coefficients between the getter material 112 and the auxiliary material 114. For example, if the getter material 112 is titanium, the thermal expansion coefficient may be 8.6 μm/mk. If the auxiliary material 114 is palladium, the thermal expansion coefficient may be 11.8 μm/mk, which is different from that of the getter material, thereby contributing to forming pores inside the absorption layer after a heat-treatment process.

According to one embodiment, the plurality of getter regions may be divided into independent regions from each other by the auxiliary material 114 as shown in FIG. 2. In other words, the getter material 112 may be provided in a nano-structure surrounded by the auxiliary material 114. Accordingly, a surface area of the getter material 112 may be increased enough to easily absorb the target gas.

Unlike the above, in case of a laminated form of the thin film getter in which an auxiliary layer is formed on a getter layer, the target gas is mainly absorbed into a surface portion of the getter layer and is not absorbed into the inside of the getter layer. Accordingly, there is a limit to a rate of absorbing the target gas.

On the other hand, according to an embodiment of the present invention, the getter material 112 may be divided into the plurality of getter regions for forming a nano-structure by the plurality of branches of the auxiliary material 114 for providing a moving path of the target gas. Accordingly, the target gas may be easily absorbed into the inside of the plurality of getter regions. Further, the target gas may be easily moved into the inside of the absorption layer 110 through the plurality of branches of the auxiliary material 114, and the target gas, which is moved into the inside of the absorption layer 110, may be easily absorbed into the getter material 112. Consequently, there may be provided a thin film getter with an improved rate and speed of absorbing the target gas and a method for manufacturing the same.

A structure of the absorption layer 110 may be controlled according to a ratio between the getter material 112 and the auxiliary material 114 in the absorption layer 110. Hereinafter, a thin film getter according to first and second modified examples of the first embodiment of the present invention and a method for manufacturing the same will be described with reference to FIGS. 3 and 4.

FIG. 3 is a view for explaining the thin film getter according to the first modified example of the first embodiment of the present invention and a method for manufacturing the same.

Referring to FIG. 3, the absorption layer 110 may be formed on the substrate 100 as described with reference to FIGS. 1 and 2, but a ratio of the getter material 112 may be relatively high in the absorption layer 110 and a ratio of the auxiliary material 114 may be relatively low. Accordingly, the plurality of getter regions of the getter material 112 may not be completely divided by the auxiliary material 114, but a part of the getter regions may be connected to each other as shown in FIG. 3.

The thin film getter according to the first modified example of the first embodiment of the present invention may have a relatively high content of the getter material 112 and a relatively low content of the auxiliary material 114 compared to those of the thin film getter according to the first embodiment as described with reference to FIGS. 1 and 2. Accordingly, a rate and capacity of absorbing the target gas may be relatively high and a speed of absorbing the target gas may be relatively slow.

FIG. 4 is a view for explaining the thin film getter according to the second modified example of the first embodiment of the present invention and a method for manufacturing the same.

Referring to FIG. 4, the absorption layer 110 may be formed on the substrate 100 as described with reference to FIGS. 1 and 2, but a ratio of the getter material 112 may be relatively low in the absorption layer 110 and a ratio of the auxiliary material 114 may be relatively high.

The thin film getter according to a second modified example of the first embodiment of the present invention may have a relatively low content of the getter material 112 and a relatively high content of the auxiliary material 114 compared to those of the thin film getter according to the first embodiment as described with reference to FIGS. 1 and 2. Accordingly, a rate and capacity of absorbing the target gas may be relatively low and a speed of absorbing the target gas may be relatively fast.

As described above, a content of the getter material 112 and the auxiliary material 114 may be adjusted in a process of forming the absorption layer 110 by simultaneously providing the getter material 112 and the auxiliary material 114 on the substrate 100 according to the first embodiment of the present invention and modified examples thereof. Accordingly, the rate, capacity and speed of absorbing the target gas may be easily controlled depending on properties of various devices to which the thin film getter is provided, thereby providing the thin film getter suitable for various applications.

In the first embodiment of the present invention and modified examples thereof as described above, it has been described that the absorption layer 110 is formed by performing an activation process in which the preliminary absorption layer 105 is formed on the substrate 100, but the absorption layer may be formed on a heated substrate according to the second embodiment of the present invention. Hereinafter, a thin film getter according to the second embodiment of the present invention and a method for manufacturing the same will be described.

A substrate 100 is prepared as described with reference to FIGS. 1 and 2. The absorption layer 110 may be formed by simultaneously providing the getter material 112 and the auxiliary material 114 onto the substrate 100 while the substrate is heated. Accordingly, the auxiliary material 114 may have a plurality of branches extending in the getter material 112 and the getter material 112 may be divided into a plurality of getter regions by the plurality of branches.

According to one embodiment, the activation process described above with reference to FIGS. 1 and 2 may be omitted. Alternatively, according to another embodiment, the activation process may be further performed after the absorption layer 110 is formed as described above.

Unlike the first and second embodiments of the present invention as described above, a protective layer may be further formed on the preliminary absorption layer 105 according to a third embodiment of the present invention. Hereinafter, a thin film getter according to a third embodiment of the present invention and a method for manufacturing the same will be described with reference to FIG. 5.

FIG. 5 is a view for explaining the thin film getter according to the third embodiment of the present invention and a method for manufacturing the same.

Referring to FIG. 5, the preliminary absorption layer 105 may be formed on the substrate 100 as described above with reference to FIGS. 1 and 2. The protective layer 120 may be formed on the preliminary absorption layer 105.

According to one embodiment, the protective layer 120 may be formed of the same material as that of the auxiliary material 114 of the preliminary absorption layer 105. In other words, the protective layer 120 may have a metal having a high permeability of the target gas. For example, if the target gas is hydrogen gas, the protective layer may include at least one of platinum (Pt), palladium (Pd), gold (Au), silver (Ag), copper (Cu), nickel (Ni), ruthenium (Ru) or rhodium (Rh).

Alternatively, according to another embodiment, the protective layer 120 may be formed of a material different from that of the auxiliary material 114 of the preliminary absorption layer 105.

Alternatively, according to still another embodiment, the protective layer 120 may be formed of a material different from that of the auxiliary material 114 of the preliminary absorption layer 105, but may include a metal having a melting point lower than that of the auxiliary material 114. For example, the protective layer 120 may include at least one of tin (Sn), lead (Pb), or copper (Cu).

The preliminary absorption layer 105 may be protected by the protective layer 120 from external physical or chemical stimulus in the atmosphere or during a package process.

After the protective layer 120 is formed, the activation process may be performed after providing the preliminary thin film getter including the substrate 100, the preliminary absorption layer 105 and the protective layer 120 in a device as described with reference to FIGS. 1 and 2.

The absorption layer 110 may be formed on the substrate 100 by performing the activation process. In the absorption layer 110, the auxiliary material 114 may have a plurality of branches extending in the getter material 112. The plurality of branches of the auxiliary material 114 extend in any direction in the getter material 112 so as to divide the getter material 112 into a plurality of getter regions.

Further, a plurality of openings for exposing the absorption layer 110 may be formed in the protective layer 120 through the activation process.

As described above, if the protective layer 120 is formed of the same material as that of the auxiliary material 114, an adhesive force may be improved between the protective layer 120 and the auxiliary material 114. Alternatively, if the protective layer 120 is formed of a material different from that of the auxiliary material 114, the adhesive force may be relatively weak between the protective layer 120 and the auxiliary material 114. Thus, even in case of carrying out the activation process at a relatively low temperature, the protective layer 120 may be subject to dewetting and thus the opening may be easily formed.

Unlike the third embodiment of the present invention as described above, a plurality of protective layers may be further formed on the preliminary absorption layer 105 according to a fourth embodiment of the present invention. Hereinafter, a thin film getter according to the fourth embodiment of the present invention and a method for manufacturing the same will be described with reference to FIG. 6.

FIG. 6 is a view for explaining the thin film getter according to the fourth embodiment of the present invention and a method for manufacturing the same.

Referring to FIG. 6, the preliminary absorption layer 105 may be formed on the substrate 100 as described above with reference to FIGS. 1 and 2. A first protective layer 120 and a second protective layer 130 may be formed on the preliminary absorption layer 105.

The first protective layer 120 may be formed of the same material as that of the auxiliary material 114 of the preliminary absorption layer 105. In other words, the first protective layer 120 may have a metal having a high permeability of the target gas. For example, if the target gas is hydrogen gas, the first protective layer may include at least one of palladium (Pd), gold (Au), silver (Ag), copper (Cu), nickel (Ni), ruthenium (Ru) or rhodium (Rh).

The second protective layer 120 may include a metal having a melting point lower than that of the first protective layer 110. For example, the protective layer 120 may include at least one of tin (Sn), lead (Pb), or copper (Cu).

The preliminary absorption layer 105 may be protected by the first and second protective layers 120 and 130 from external physical or chemical stimulus in the atmosphere or during a package process.

After the first and second protective layers 120 and 130 are formed, the activation process may be performed after providing the preliminary thin film getter including the substrate 100, the preliminary absorption layer 105 and the first and second protective layers 120 and 130 in a device as described with reference to FIGS. 1 and 2.

The absorption layer 110 may be formed on the substrate 100 by performing the activation process. In the absorption layer 110, the auxiliary material 114 may have a plurality of branches extending in the getter material 112. The plurality of branches of the auxiliary material 114 extend in any direction in the getter material 112 so as to divide the getter material 112 into a plurality of getter regions.

Further, the first protective layer 120 and the second protective layer 130 may be subject to alloying through the activation process, so that the an alloy layer 140 may be formed and an opening for exposing the absorption layer 110 may be formed in the alloy layer 140.

As described above, if the second protective layer 130 is formed of a metal having a melting point lower than that of the first protective layer 120, the first protective layer 120 and the second protective layer 130 may be easily subject to alloying at a relatively low temperature. Accordingly, a temperature of heat-treatment may become low in the activation process for forming the opening for exposing the absorption layer 110.

Unlike the above, the activation process may be performed at a high temperature according to the conventional activation process, so that an additional heat source is to be attached inside the getter accordingly. Due to the attachment of the additional heat source, there is a limit to downsizing the getter and there is a problem that deterioration of the device occurs due to the high-temperature activation process. In addition, if a material for preventing heat damage is coated to prevent the device from deteriorating in the high-temperature activation process, there is a problem that the inside of the device in a vacuum state may be contaminated by the gas generated by the high-temperature activation process.

However, as described above, according to an embodiment of the present invention, the activation process may be performed at a relatively low temperature, so that the attachment of the additional heat source in the getter may be omitted, thereby solving the problems caused by the high-temperature process.

It is apparent to those skilled in the art that the various technical ideas described in the first embodiment, the first modified example of the first embodiment, the second modified example of the first embodiment, the second embodiment, the third embodiment and the fourth embodiment as described above may be combined with each other. Specifically, the absorption layer according to the first modified example of the first embodiment and the second modified example of the first embodiment may be applied to the second to fourth embodiments, and the protective layers according to the third and fourth embodiments may be provided onto the absorption layer according to the second embodiment.

Hereinafter, specific experimental embodiments will be described with regard to the thin film getter according to an embodiment of the present invention and the method for manufacturing the same.

MANUFACTURING OF TI THIN FILM ACCORDING TO COMPARATIVE EXAMPLE 1

A 4-inch silicon substrate was prepared, and a Ti thin film, which is a getter material, was deposited onto the silicon substrate by a sputtering method. Specifically, the silicon substrate was loaded in a sputtering chamber, after which a Ti target with a purity of 99.95% was placed in the chamber, and then argon gas was injected into the chamber with power of 100 W and $10^{-2}$ Torr so as to generate plasma. A sputtering process was performed for 15 minutes to prepare a Ti thin film according to Comparative Example 1.

MANUFACTURING OF PD THIN FILM ACCORDING TO COMPARATIVE EXAMPLE 2

A 4-inch silicon substrate was prepared, and a Pd thin film, which is an auxiliary material, was deposited onto the silicon substrate by a sputtering method. Specifically, the silicon substrate was loaded in a sputtering chamber, after which a Pd target with a purity of 99.99% was placed in the chamber, and then argon gas was injected into the chamber with power of 150 W and $10^{-2}$ Torr so as to generate plasma. A sputtering process was performed for 15 minutes to prepare a Pd thin film according to Comparative Example 1.

MANUFACTURING OF TI—PD THIN FILM ACCORDING TO EXAMPLE 1

A 4-inch silicon substrate was prepared, and Pd, which is an auxiliary material, and Ti, which is a getter material, were simultaneously deposited onto the silicon substrate by a sputtering method. Specifically, the silicon substrate was loaded in a sputtering chamber, after which a Pd target with a purity of 99.99% and a Ti target with a purity of 99.95% were placed in the chamber, then 150 W and 100 W were applied thereto respectively, and then argon gas was injected into the chamber with $10^{-2}$ Torr so as to generate plasma. A sputtering process was performed for 10 minutes to prepare a Ti—Pd thin film according to Example 1.

MANUFACTURING OF TI—PD THIN FILM ACCORDING TO EXAMPLE 2

Pd was further deposited as a protective layer onto the thin film getter according to Example 1. Specifically, a Pd protective layer was deposited onto the thin film getter according to Example 1 under the same process conditions as those of the Pd thin film according to Comparative Example 2 so as to prepare a Ti—Pd thin film according to Example 2, in which the Pd protective layer was deposited onto the Ti—Pd thin film according to Example 1.

FIG. 7 is an FE-SEM picture showing the thin film according to Example 1 and Comparative Examples 1 to 2 of the present invention.

Referring to FIG. 7, FE-SEM pictures of the Ti thin film according to Comparative Example 1, the Pd thin film according to Comparative Example 2, and the Ti—Pd thin film according to Example 1 were taken. In FIGS. 7, (A), (B) and (C) are FE-SEM pictures of the Ti thin film according to Comparative Example 1, the Pd thin film according to Comparative Example 2, and the Ti—Pd thin film according to Example 1, respectively.

As a result of analyzing a surface composition and shape with the Ti—Pd thin film according to Example 1, it may be seen that a relatively homogeneous thin film having an average content ratio (at %) of Ti:Pd=85:15 was deposited.

FIG. 8 is a STEM and TEM-EDS mapping picture showing the Ti—Pd thin film according to Example 2 of the present invention.

Referring to FIG. 8, an analysis was made on STEM and TEM-EDS mapping data of the Ti—Pd thin film according to Example 2. As a result of a sectional STEM analysis, it may be confirmed that the thickness of the Ti—Pd thin film is about 500 nm and the Pd protective layer having the thickness of 35 nm is formed on the Ti—Pd thin film. In addition, it may be confirmed from the TEM-EDS mapping results of the sectional STEM picture that the Ti—Pd thin film is formed on the silicon substrate and the Ti—Pd thin film is homogeneously formed without peeling off from the substrate.

FIG. 9 is a graph showing TEM-EDS results of the Ti—Pd thin film according to Example 2 of the present invention.

Referring to FIG. 9, it may be confirmed that no other impurities are present in the Ti—Pd thin film with an exception of a carbon (C) peak used as a coating film for TEM analysis. Further, as a result of the composition analysis, it may be confirmed that the content of Ti is about 10 to 15 at % in the Ti—Pd thin film. As described above, the ratio of the Ti getter material and the Pd auxiliary material may be controlled in the Ti—Pd thin film through various parameters such as power, target composition, degree of vacuum, deposition time, etc.

FIG. 10 is an FE-SEM picture showing the thin film getter according to Example 2 of the present invention.

Referring to FIG. 10, the Ti—Pd thin film according to Example 2 was subject to an activation process of heat-treating at a temperature of 200° C., 300° C. and 400° C. for four hours under a vacuum of $1\times10^{-4}$ Torr so as to manufacture a thin film getter according to Example 2, which includes a Ti—Pd absorption layer. In FIG. 10, (A) to (C) are FE-SEM pictures of the thin film getters, in which the activation process was performed at 200° C., 300° C. and 400° C., respectively.

It may be seen that the Ti—Pd thin film is maintained up to 300° C. without any change in shape, but the surface roughness is increased at 400° C. In addition, as a result of the sectional shape analysis, it may be seen that the Pd protective layer deposited with a thickness of 35 nm is subject to dewetting from the Ti—Pd thin film and aggregates in the form of particles. In other words, a thermal energy sufficient for atomic movement may be provided to give roughness of several hundred nano units onto the surface of the Ti—Pd absorption layer, which may expose the Ti—Pd absorption layer toward the surface, thereby activating the getter material.

FIG. 11 is a graph showing XRD analysis results from the activation process of the Ti—Pd thin film according to Example 2 of the present invention.

Referring to FIG. 11, an analysis was made on the XRD data of the Ti—Pd thin film according to Example 2, the thin film getter subjected to the activation process at 200° C., and the thin film getter subjected to the activation process at 400° C. It may be seen from the analysis data that the peak of the Pd protective layer deposited onto the surface mainly appears and the Ti peak appears at a low intensity after the heat treatment at 400° C. This is considered to be attributable to the Ti getter material exposed at a surface in such a way that the Pd protective layer on the surface is subject to dewetting after heat-treatment and aggregates in the form of particles and thus the Ti—Pd absorption layer at the lower end is exposed toward the surface. Further, the results of calculating an average size of Pd and Ti nanoparticles based on the Scherrer formula using Pd (111), Pd (220) and Ti (002) diffraction peaks are shown in the table of FIG. 11. The average size of Pd particles was 13.4-18.4 nm, and the size of Ti particles was measured to be 20.7 nm. Thus, it may be confirmed that a Ti—Pd-based getter material is synthesized to have a nanostructure.

FIG. 12 is an HR-TEM picture showing the Pd protective layer on the Ti—Pd thin film according to Example 2 of the present invention.

Referring to FIG. 12, the HR-TEM picture of the thin film getter including the Ti—Pd thin film and the Pd protective layer was taken as described with reference to FIG. 10.

A surface region of the HR-TEM analysis shows the surface of the Pd protective layer deposited with a thickness of 35 nm. In the analysis of a lattice distance, it may be confirmed that PdO is formed in the directions of (112) and (110) and the thickness thereof is about 10 nm, which is close to 30% of the total Pd protective layer. The PdO layer causes a difference of thermal expansion coefficients between the metal and the oxide which form the Pd protective layer. Further, conversion into Pd $PdO_2$ through control of an additional heat treatment process may form defects while changing a volume of about 38%. Thus, it is possible to lower an activation temperature by adjusting the thickness of the Pd protective layer, the thickness of the upper PdO layer, and the thickness ratio of the metal and the oxide.

FIG. 13 is an HR-TEM picture showing a Ti—Pd absorption layer of the thin film getter according to Example 2 of the present invention.

Referring to FIG. 13, HR-TEM pictures of the thin film getter including the Ti—Pd absorption layer and the Pd protective layer, in which an activation process was performed at 400° C., were taken as described with reference to FIG. 10.

From the HR-TEM analysis, it was shown that an inner region is near the silicon substrate of the Ti—Pd absorption layer deposited with a thickness of 560 nm. In the analysis of the lattice distance, it may be confirmed that there appears Ti in the direction of (100) and Pd in the directions of (100), (111), (200) and (111) and has a structure in which Ti particles are surrounded by Pd which is amorphous or crystallized in a nano size. At this time, an interstitial distance of Ti may be larger than 0.256 nm in the direction of (100), indicating that solid solution or partial alloy is formed. In other words, it may be confirmed that the hydrogen adsorption occurs in both the Ti—Pd absorption layer and the metal, solid solution or alloy formed through the heat treatment.

Further, as described above, the Ti serves as a getter material and Pd serves as a protective material, and hydrogen gas absorbed on the surface is transferred to the inside of the Ti—Pd absorption layer and adsorbed, thereby maximizing the degree of hydrogen adsorption. Thus, it may be seen that various types of nano-structures are formed by controlling the heat treatment conditions of the Ti—Pd thin film including the getter material and the protective material.

FIG. 14 is a graph showing results of analyzing the degree of hydrogen absorption according to a temperature of the activation process of the Ti—Pd thin film according to Example 2 of the present invention, and FIG. 15 is a graph comparing degrees of hydrogen absorption according to temperatures of the activation process of the Ti—Pd thin film according to Example 2 of the present invention.

Referring to FIGS. 14 and 15, an analysis was made on a degree of physicochemical absorption of hydrogen on the thin film getter including the Ti—Pd absorption layer and the Pd protection layer, in which the activation process was performed at 200° C. and 400° C. respectively, as described with reference to FIG. 10.

The primary adsorption shown in each graph of FIGS. 14 and 15 indicates an amount of physical adsorption+chemical absorption, and the secondary adsorption indicates an amount of physical adsorption, in which a difference in the adsorption amounts is indicated as the amount of chemical adsorption. All the analyses were made at the room temperature. As described above in FIGS. 1 and 2, the activation process allowed the Ti—Pd thin film to have a nanostructure, activated the Pd protective layer, and removed moisture and residual gas from the thin film getter in terms of the property evaluation. The property of hydrogen absorption may be confirmed in such a way that the degree of adsorption is greatly increased at the heat treatment at 400° C. and thus reached 0.5 cctorr/cm$^2$ or more in the whole range.

Although the present invention has been described in detail with reference to exemplary embodiments, the scope of the present invention is not limited to a specific embodiment and should be interpreted by the attached claims. In addition, those skilled in the art should understand that many modifications and variations are possible without departing from the scope of the present invention.

INDUSTRIAL APPLICABILITY

A thin film getter according to embodiments of the present invention and a method for manufacturing the same may be applied to various devices such as a semiconductor device, a sensor device, a light emitting device, etc.

The invention claimed is:

1. A thin film getter comprising:
a substrate; and
an absorption layer on the substrate,
wherein the absorption layer comprises:
 a getter material for absorbing target gas; and
 an auxiliary material for providing a moving path of the target gas, and
wherein the getter material is divided into a plurality of getter regions by the auxiliary material.

2. The thin film getter of claim 1, wherein the auxiliary material comprises a plurality of branches extending in the getter material and the getter material is divided into the plurality of getter regions by the plurality of branches.

3. The thin film getter of claim 1, wherein
an absorption amount of the target gas is increased as a content of the getter material is increased in the absorption layer, and
a speed of absorbing the target gas is increased as a content of the auxiliary material is increased in the absorption layer.

4. The thin film getter of claim 1, wherein the getter material and the auxiliary material are simultaneously provided in a same process.

5. The thin film getter of claim 1, wherein the target gas comprises hydrogen gas.

6. The thin film getter of claim 1, further comprising a protective layer disposed on the absorption layer and formed of a material different from the auxiliary material.

7. The thin film getter of claim 6, wherein the protective layer has a melting point lower than a melting point of the auxiliary material.

8. A method for manufacturing a thin film getter, the method comprising:
preparing a getter material for absorbing target gas and an auxiliary material for providing a moving path of the target gas; and
forming an absorption layer comprising the getter material and the auxiliary material on a substrate by:
 forming a preliminary absorption layer by simultaneously providing the getter material and the auxiliary material on the substrate, and
 forming the absorption layer by carrying out an activation process of heat-treating the preliminary absorption layer so that the auxiliary material has a plurality of branches extending in the getter material and the getter material is divided into a plurality of getter regions by the plurality of branches.

9. The method of claim 8, further comprising forming a protective layer on the preliminary absorption layer, wherein the protective layer is heat-treated by the activation process of the preliminary absorption layer, so as to form a plurality of openings for exposing the absorption layer in the protective layer.

10. A method for manufacturing a thin film getter, the method comprising:
preparing a getter material for absorbing a target gas and an auxiliary material for providing a moving path of the target gas; and
forming an absorption layer comprising the getter material and the auxiliary material on a substrate by simultaneously providing the getter material and the auxiliary material onto the substrate, so that the auxiliary material comprises a plurality of branches extending in the getter material and the getter material is divided into a plurality of getter regions by the plurality of branches.

11. A method for manufacturing a thin film getter, the method comprising:
preparing a getter material for absorbing a target gas and an auxiliary material for providing a moving path of the target gas; and
forming an absorption layer comprising the getter material and the auxiliary material on a substrate by simultaneously providing the getter material and the auxiliary material on the substrate,
wherein the getter material and the auxiliary material are simultaneously provided onto the substrate through sputtering or vapor deposition methods.

* * * * *